United States Patent
Wei et al.

(10) Patent No.: US 9,299,556 B2
(45) Date of Patent: Mar. 29, 2016

(54) METHOD FOR PREPARING SEMICONDUCTOR SUBSTRATE WITH INSULATING BURIED LAYER GETTERING PROCESS

(75) Inventors: Xing Wei, Shanghai (CN); Zhongdang Wang, Shanghai (CN); Fei Ye, Shanghai (CN); Gongbai Cao, Shanghai (CN); Chenglu Lin, Shanghai (CN); Miao Zhang, Shanghai (CN); Xi Wang, Shanghai (CN)

(73) Assignees: SHANGHAI SIMGUI TECHNOLOGY CO. LTD., Shanghai (CN); SHANGHAI INSTITUTE OF MICROSYSTEM AND INFORMATION TECHNOLOGY, CHINESE ACADEMY OF SCIENCES, Shanghai (CN)

( * ) Notice: Subject to any disclaimer, the term of this patent is extended or adjusted under 35 U.S.C. 154(b) by 34 days.

(21) Appl. No.: 13/976,486

(22) PCT Filed: Dec. 31, 2010

(86) PCT No.: PCT/CN2010/080599
§ 371 (c)(1),
(2), (4) Date: Jun. 27, 2013

(87) PCT Pub. No.: WO2012/088710
PCT Pub. Date: Jul. 5, 2012

(65) Prior Publication Data
US 2013/0273714 A1    Oct. 17, 2013

(30) Foreign Application Priority Data

Dec. 27, 2010 (CN) .......................... 2010 1 0607936
Dec. 27, 2010 (CN) .......................... 2010 1 0608061

(51) Int. Cl.
| | | |
|---|---|---|
| H01L 21/02 | (2006.01) | |
| H01L 21/322 | (2006.01) | |
| H01L 21/762 | (2006.01) | |

(52) U.S. Cl.
CPC ...... *H01L 21/02038* (2013.01); *H01L 21/3226* (2013.01); *H01L 21/76254* (2013.01)

(58) Field of Classification Search
CPC ................. H01L 21/76254; H01L 21/3226; H01L 21/2007; H01L 21/02038; H01L 21/23533; H01L 21/76243
See application file for complete search history.

(56) References Cited

U.S. PATENT DOCUMENTS

| | | | |
|---|---|---|---|
| 5,444,001 A | 8/1995 | Tokuyama | |
| 6,492,682 B1 * | 12/2002 | Akiyama et al. | 257/347 |

(Continued)

FOREIGN PATENT DOCUMENTS

| | | |
|---|---|---|
| CN | 1564323 A | 1/2005 |
| CN | 1744298 A | 3/2006 |

(Continued)

OTHER PUBLICATIONS

JP 09-022993 INABA, Jan. 21, 1997, Machine English Translation.*

*Primary Examiner* — Bac Au
(74) *Attorney, Agent, or Firm* — Mark M. Friedman (57) ABSTRACT

A method for preparing a semiconductor substrate with an buried insulating layer by a guttering process, includes the following steps: providing a device substrate and a supporting substrate; forming an insulating layer on a surface of the device substrate; performing a heating treatment on the device substrate, so as to form a denuded zone on the surface of the device substrate; bonding the device substrate having the insulating layer with the supporting substrate, such that the insulating layer is sandwiched between the device substrate and the supporting substrate; annealing and reinforcing a bonding interface, such that an adherence level of the bonding interface meets requirements in the following chamfering grinding, thinning and polishing processes; performing the chamfering grinding, thinning and polishing processes on the device substrate which is bonded.

3 Claims, 4 Drawing Sheets

(56) References Cited

U.S. PATENT DOCUMENTS

| | | | |
|---|---|---|---|
| 6,566,233 B2 | 5/2003 | Yokokawa et al. | |
| 6,680,260 B2 | 1/2004 | Akiyama et al. | |
| 6,959,854 B2 | 11/2005 | Yokokawa et al. | |
| 7,528,049 B2 | 5/2009 | Ikeda et al. | |
| 7,615,467 B2 | 11/2009 | Shiota et al. | |
| 7,910,455 B2 | 3/2011 | Yoshida et al. | |
| 8,709,911 B2 | 4/2014 | Matsumine | |
| 2003/0170990 A1* | 9/2003 | Sakaguchi et al. | 438/690 |
| 2005/0112845 A1* | 5/2005 | Ghyselen | H01L 21/3225 438/455 |
| 2006/0121696 A1* | 6/2006 | Shiota et al. | 438/459 |
| 2008/0020168 A1 | 1/2008 | Falster | |
| 2008/0251879 A1* | 10/2008 | Adachi et al. | 257/506 |
| 2008/0268263 A1 | 10/2008 | Yamazaki | |
| 2010/0044829 A1 | 2/2010 | Matsumine | |
| 2010/0078767 A1 | 4/2010 | Park | |
| 2010/0273310 A1* | 10/2010 | Hanaoka et al. | 438/458 |
| 2011/0037123 A1 | 2/2011 | Yamazaki | |

FOREIGN PATENT DOCUMENTS

| | | |
|---|---|---|
| CN | 101114574 A | 1/2008 |
| CN | 101432849 A | 5/2009 |
| CN | 101669193 A | 3/2010 |
| CN | 101675499 A | 3/2010 |
| CN | 101908472 A | 12/2010 |
| JP | H0555230 A | 3/1993 |
| JP | H05109677 A | 4/1993 |
| JP | H06196490 A | 7/1994 |
| JP | 1996236735 A | 9/1996 |
| JP | H08316443 A | 11/1996 |
| JP | 09022993 A * | 1/1997 |
| JP | H09260619 A | 10/1997 |
| JP | H11251277 A | 9/1999 |
| JP | 2001144275 A | 5/2001 |
| JP | 2004319642 A | 11/2004 |
| JP | 2006165062 A | 6/2006 |
| JP | 2008277702 A | 11/2008 |
| JP | 2009147357 A | 7/2009 |

* cited by examiner

METHOD FOR PREPARING SEMICONDUCTOR SUBSTRATE WITH INSULATING BURIED LAYER GETTERING PROCESS

BACKGROUND OF THE INVENTION

1. Field of the Invention

The present invention generally relates to a method for preparing silicon-on-insulator (SOI) material, and more particularly to a method for preparing a semiconductor substrate with an insulating buried layer by a gettering process.

2. Description of Prior Art

With miniaturization of feature sizes of integrated circuits, it is important to control defects in single crystal silicon. The defects in silicon wafers mainly come from two aspects. In one aspect, grow-in defects, such as crystal originated particles (COPs), are produced during crystal growth processes. In the other aspect, defects are produced when performing heating treatments on the silicon wafers, such as oxygen precipitation. If these defects are positioned in active regions on surfaces of the silicon wafers, performance of devices is deteriorated and the devices are failed. Furthermore, when the silicon wafers are processed and the integrated circuits are manufactured, they are inevitable to be polluted by metals, such as Cu, Ni, Fe and so on. These metal impurities diffuse fast in the silicon. If the metal impurities exist in the active regions of the devices, the devices are failed. Accordingly, it is quite important to effectively remove the metal impurities on the surfaces of the silicon wafers. The oxygen precipitation and induced defects thereof may be served as gettering points for gettering the metal impurities, such that the metal impurities are collected in the defects. But if the oxygen precipitation and the induced defects occur in the active regions of the devices, electrical performances of the devices are affected as well. Accordingly, on the one hand, the oxygen precipitation is required to be produced in the silicon wafers for achieving a gettering function in device technology, but on the other hand, it is hoped that the oxygen precipitation does not occur in the active regions of the silicon wafers. These are basic ideas of internal gettering. In the internal gettering technology of the silicon wafers, denuded zones (DZ) with low oxygen and low metal are formed on the surfaces of the silicon wafers by the heating treatments, and the oxygen precipitation and the induced defects are formed inside the silicon wafers for gettering the metal impurities. After the DZ technology processes are performed on the silicon wafers, the devices are prepared in the DZ and yields of the devices may be effectively increased.

Furthermore, thick-film SOI materials (a top silicon layer is usually greater than 1 μm) are widely applied to high-voltage power devices and microelectromechanical system (MEMS) fields and have rapid development especially in automotive electronics, displays and wireless communications. Since control and conversion of power, automotive electronics and power consuming devices have high requirements for harsh environment, high temperature, high current and high power, the SOI devices must be utilized based on strict requirements of reliability. Currently, users of the thick-film SOI materials mainly comprise Maxim USA, ADI, TI (USA), NEC Japan, Toshiba, Panasonic, Denso, TI (Japan), FUJI, Omron, Philips European and X-Fab. Among the users of the thick-film SOI materials, a lot of applications mainly come from driving circuits in the applications. For instance, the main applications of Maxim are amplifying circuits in mobile receivers, The main applications of Panasonic, TI, FUJI, Toshiba and NEC are scan driving circuits in display driving circuits. The applications of DENSO are automotive electronics and wireless radio frequency circuits. The applications of Toshiba are power control circuits in air conditionings. The applications of Omron mainly comprise sensors. The applications of ADI mainly comprise high-temperature circuits and sensors. The applications of Phillips mainly comprise LDMOS in power devices for consuming electronics, such as car stereos and audio amplifiers. The applications of Magnchip (Hynix) in Korea comprise display driving circuits in digital cameras produced for Kopin and display driving circuits in PDPs produced for LG.

However, since a buried oxide layer exists in the SOI material exists, oxygen elements are externally diffused after the heating treatments and the oxygen elements in the top silicon layer are increased. Accordingly, traditional gettering processes are not suitable for the SOI materials, and the DZ regions do not exist in the top silicon layer, such that the device yields by utilizing the SOI materials are relatively low.

SUMMARY OF THE INVENTION

A technical problem solved by the present invention is to provide a method for preparing a semiconductor substrate with a buried insulating layer by a gettering process.

To solve the above-mentioned problem, the present invention provides a method for preparing a semiconductor substrate with a buried insulating layer by a gettering process, which comprises the following steps of: providing a device substrate and a supporting substrate; forming an insulating layer on a surface of the device substrate; performing a heating treatment on the device substrate, so as to form a denuded zone on the surface of the device substrate; bonding the device substrate having the insulating layer with the supporting substrate, such that the insulating layer is sandwiched between the device substrate and the supporting substrate; annealing and reinforcing a bonding interface, such that an adherence level of the bonding interface meets requirements in the following chamfering grinding, thinning and polishing processes; and performing the chamfering grinding, thinning and polishing processes on the device substrate which is bonded.

In one preferred technical scheme, the device substrate is a single crystal silicon substrate.

In one preferred technical scheme, the method further comprises the following steps of: performing an additional annealing and reinforcing process on the bonding interface after performing the chamfering grinding, thinning and polishing processes on the device substrate.

In one preferred technical scheme, the step of performing the heating treatment on the device substrate further comprises: a first heating treatment step for forming a crystal zone on the surface of the device substrate; and a second heating treatment step in which a temperature is lower than a temperature in the first heating treatment step, such that nucleation of saturated oxygen elements outside the denuded zone of the device substrate occurs.

In one preferred technical scheme, the step of performing the heating treatment on the device substrate further comprises: a third heating treatment step for making the nucleation of the oxygen elements in the second heating treatment step form a larger oxygen precipitation, and meanwhile the oxygen precipitation can getter metal impurities in the denuded zone.

In one preferred technical scheme, the method further comprises the following steps of: forming a protective layer on an exposed surface of the supporting substrate before performing the chamfering grinding, thinning and polishing processes on the device substrate.

An advantage of the present invention is that the gettering process is performed on the device substrate before bonding. The denuded zone is formed on the surface, and then the denuded zone is transferred to the supporting substrate for obtaining bonding material with high crystal quality. For further consideration of thermal stability of the oxygen precipitation inside the device substrate, two steps of annealing processes may be chosen to be implemented in the preparing process. The first annealing step is a low-temperature annealing, such that the bonding strength meets the requirements in the grinding and polishing processes, Finally, the second step is utilized for reinforcing the bonding strength for forming covalent bonds in the interface.

Furthermore, in the heating treatment process, only the first and second heating treatment steps are performed on the device substrate, and the third high-temperature heating treatment step and the subsequent step of reinforcing the bonding interface are integrated as one step, thereby reducing the process complexity, saving the process cost and increasing the process efficiency.

DETAILED DESCRIPTION OF THE INVENTION

A method for preparing a semiconductor substrate with a buried insulting layer by a gettering process in accordance with an embodiment of the present invention is described with referring to appended figures.

Figure 1:
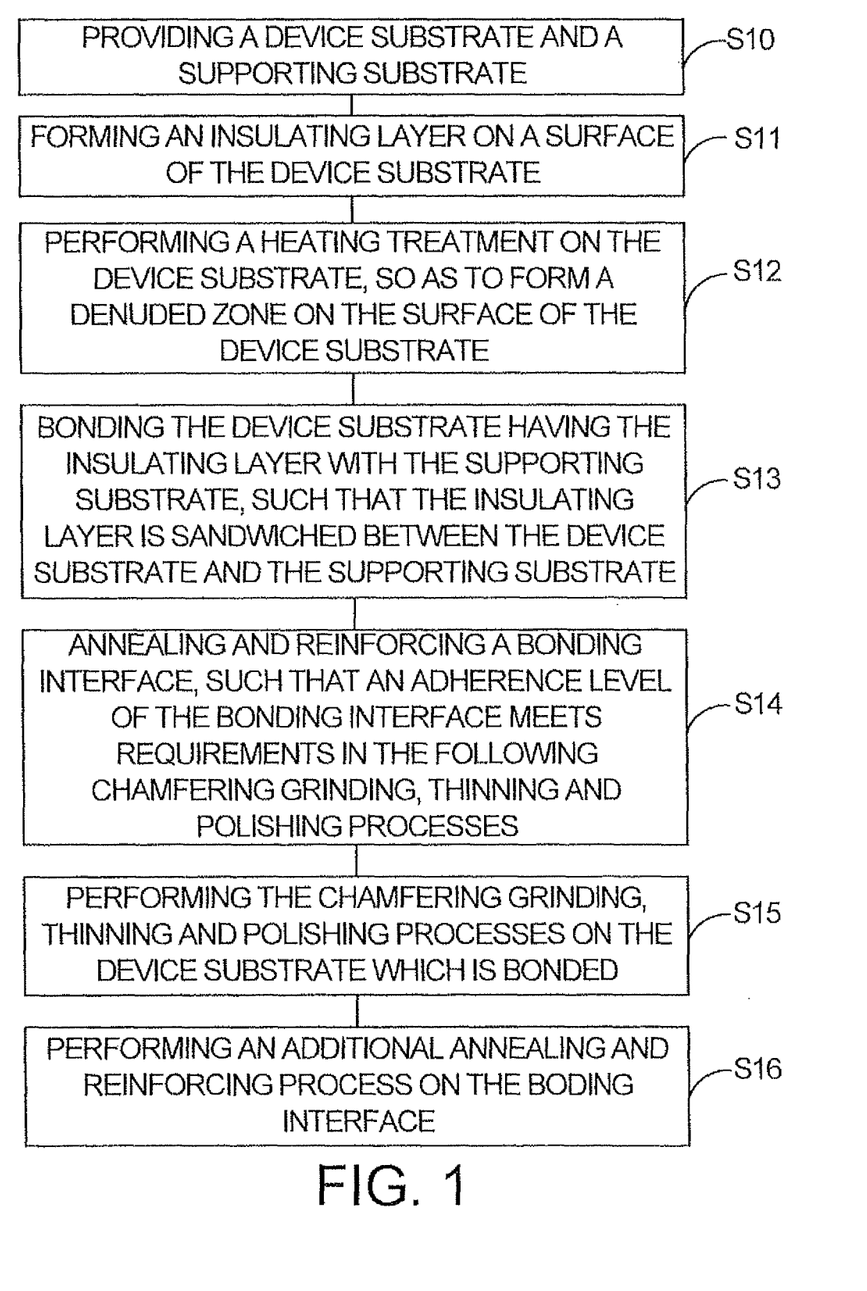
FIG. 1 is a flowchart of implementation processes of the present method.

FIG. 1 is a flowchart of implementation processes of the present method, which comprises: Step S10, providing a device substrate and a supporting substrate; Step S11, forming an insulating layer on a surface of the device substrate; Step S12, performing a heating treatment on the device substrate, so as to form a denuded zone on the surface of the device substrate; Step S13, bonding the device substrate having the insulating layer with the supporting substrate, such that the insulating layer is sandwiched between the device substrate and the supporting substrate; Step S14, annealing and reinforcing a bonding interface, such that an adherence level of the bonding interface meets requirements in the following chamfering grinding, thinning and polishing processes; Step S15, performing the chamfering grinding, thinning and polishing processes on the device substrate which is bonded; Step S16, performing an additional annealing and reinforcing process on the boding interface.

FIG. 2A to FIG. 2E are schematic diagrams of processes in accordance with an embodiment of the present invention.

Figure 2A:
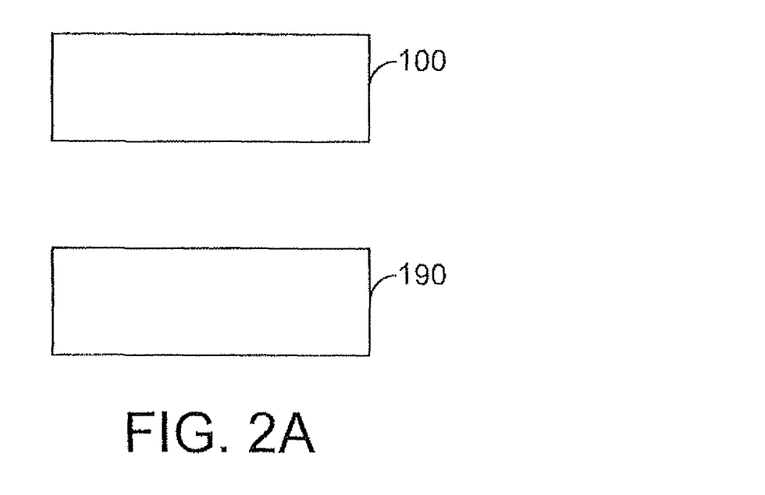
FIG. 2A to FIG. 2E are schematic diagrams of processes in accordance with an embodiment of the present invention.

Referring to step S10 as shown in FIG. 2A, a device substrate 100 and a supporting substrate 190 are provided. The device substrate 100 is utilized for forming a device layer of a final product, and thus material thereof should be a common semiconductor material, such as single crystal silicon or other compound semiconductor. The supporting substrate 190 only has a supporting function, and thus material selection thereof has a wide range. In addition to the single crystal silicon or other compound semiconductor, sapphire or a metal substrate may be utilized. In the present embodiment, both of the device substrate 100 and the supporting substrate 190 are made of single crystal silicon.

Figure 2B:
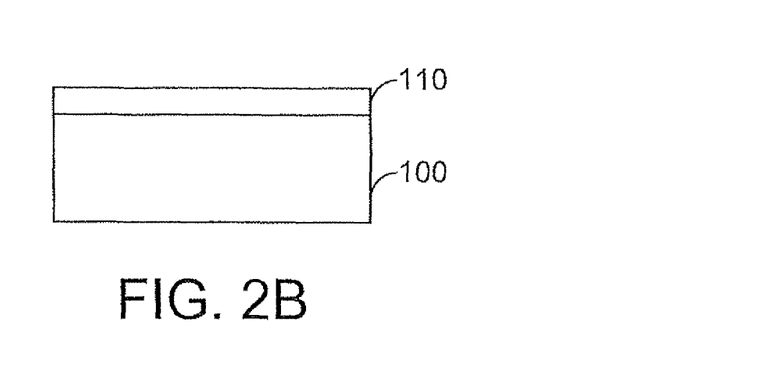

Referring to Step S11 as shown in FIG. 2B, an insulating layer 110 is formed on a surface of the device substrate 100. The insulating layer 110 is utilized for forming a buried insulating layer of the final product, and material thereof may be silicon oxide, silicon nitride and so on. A growth method may be a chemical vapor deposition or thermal oxidation (utilized for forming a silicon oxide insulating layer on the surface of the single crystal silicon substrate).

Figure 2C:
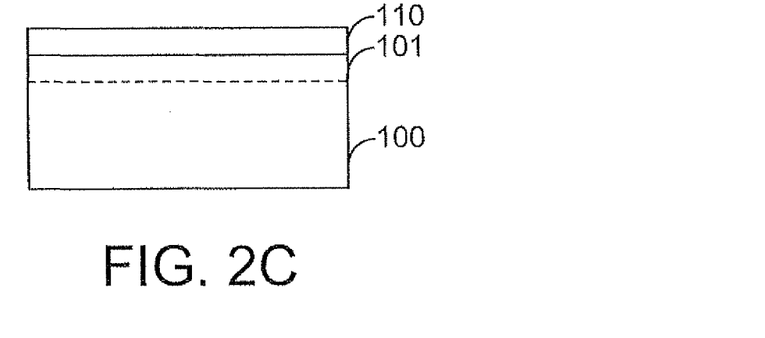

Referring to Step S12 as shown in FIG. 2C, a heating treatment is performed on the device substrate 100, so as to form a denuded zone 101 on the surface of the device substrate 100.

The above-mentioned step may be further divided into three heating treatment steps comprising a heat-up step, a cool-down step and a heat-up step. In a first heating treatment step, a crystal zone is formed on the surface of the device substrate 100. In a second heating treatment step, a temperature is lower than that in the first heating treatment annealing step, such that a nucleation of saturated oxygen elements outside the denuded zone of the device substrate occurs. In a third heating treatment step, a larger oxygen precipitation is formed from the nucleation of the oxygen elements in the second heating treatment step, and meanwhile the oxygen precipitation can getter metal impurities in the denuded zone.

Specifically, the first heating treatment step is a heat-up step. A target temperature is one temperature in a range of 900° C.-1400° C. A preferred target temperature is 1250° C. After the target temperature is reached, an annealing time lasts for 0.5-20 hours. A preferred annealing time is 4 hours. A heat-up rate is 0.5-20° C./minute. A preferred heat-up rate is 3° C./minute. A preferred protective atmosphere during the heat-up process is $Ar/O_2$ mixture, other gas or other gas mixture. An annealing atmosphere may be one of $N_2$, Ar (or other inert gas), $H_2$, $O_2$, $N_2/O_2$ mixture, $Ar/O_2$ mixture, $Ar/H_2$ mixture and $N_2/Ar$ mixture. In the first heat-up and annealing process, an out diffusion of interstitial oxygen occurs near the surface of the device substrate 100. In the present step, a width of the denuded zone 101 is determined by the annealing temperature and time. The width of the denuded zone 101 is 10-50 μm in general.

The second heating treatment step is a cool-down step. A cool-down rate is 0.5-20° C./minute. A preferred cool-down rate is 3° C./minute. A target cool-down temperature is one temperature in a range of 500~900° C. A preferred target temperature is 750° C. After the target temperature is reached, an annealing time lasts for 0.5-64 hours. A preferred time is 8 hours. An annealing atmosphere is an oxygen-free atmosphere, and more particularly is $N_2$, Ar (or other inert gas), $H_2$, or mixture of the above-mentioned gases. In the present cool-down step, the nucleation of the saturated oxygen elements outside the denuded zone 101 of the device substrate 100 occurs.

The third heating treatment step is a heat-up step. A heat-up rate is 0.5-20° C./minute. A preferred heat-up rate is 3° C. /minute. A target temperature is one temperature in a range of 900-1400° C. A preferred target temperature is 1150° C. After the target temperature is reached, an annealing time lasts for 0.5-40 hours. A preferred time is 16 hours. An annealing atmosphere is an oxygen-free atmosphere, and more particularly is $N_2$, Ar (or other inert gas), $H_2$, or mixture of the above-mentioned gases. In the present step, the larger oxygen precipitation is formed from the nucleation of the oxygen elements outside the denuded zone 101 of the device substrate 100, and meanwhile the oxygen precipitation can effectively getter metal impurities in the denuded zone 101.

In order to simplify the process for saving the annealing time, the present invention may implement only the first and second heating treatment steps. The third heat-up heating treatment step and the following step of reinforcing the bonding interface may be integrated as one step for reducing the process complexity, saving the process cost and increasing the process efficiency.

An implementation order of the above-mentioned steps S11 and S12 may be changeable. An advantage of implementing step S11 first is that the insulating layer 110 formed in advance can protect the surface of the device substrate 100 and reduce the time of the heating treatment, thereby decreasing the cost. When step S11 is implemented after step S12 and the device substrate 100 is single crystal silicon, a cool-down step may be implemented in situ after the second heat-up step. A cool-down rate is 0.5-20° C./minute. A preferred cool-down rate is 3° C./minute. A target cool-down temperature is one temperature in a range of 900-1400° C. A preferred target temperature is 1050° C. After the cool-down step, in-situ oxidation process is implemented. An oxidation time is determined by a required thickness of an oxide layer. An oxidation atmosphere is a dry oxidation atmosphere, a wet oxidation atmosphere or Ar/O$_2$ mixture. After the oxidation process, the oxide layer is formed and the oxide layer may be served as the insulating layer 110.

Figure 2D:
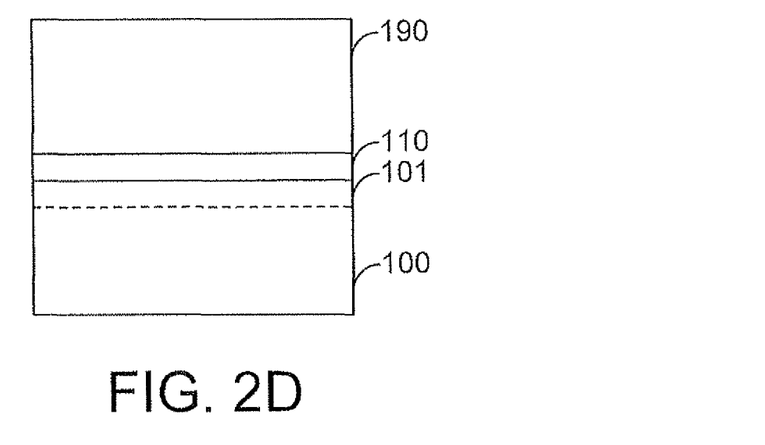

Referring to Step S13 as shown in FIG. 2D, the device substrate 100 having the insulating layer 110 is bonded with the supporting substrate 190, such that the insulating layer 110 is sandwiched between the device substrate 100 and the supporting substrate 190.

When the supporting substrate 190 is a single crystal silicon substrate, preprocesses including a grinding process and a polishing process can be chosen to be performed on the single crystal silicon substrate 190 before the bonding process, thereby thinning the thickness. Taking an 8-inch single crystal silicon substrate for example, a thickness of the substrate is 750 µm, and a total thickness error of the substrate is smaller than 4 µm. A target thickness is 650 µm after thinning the substrate. Firstly, the single crystal silicon substrate is ground and thinned. A preferred grinding apparatus is a single-side grinding machine. A device model of the grinding machine is DFG841. A coarse grinding process is performed for achieving rapid thinning at a grinding wheel speed greater than 2000 rpm. Then, a fine grinding process is performed at a grinding wheel speed greater than 2000 rpm for reducing damage resulted from the coarse grinding process. After the grinding processes, the thickness of the substrate is greater than the target thickness by at least 3 µm. Herein, the supporting substrate 190 is thinned to be 660 µm. A polishing process is performed on the ground supporting substrate 190. The polishing process may be a single-side polishing process or a double-side polishing process, and it may be the double-side polishing process together with the single-side polishing process. Herein, the preferred polishing process is the double-side polishing process together with the single-side polishing process. Firstly, the double-side polishing process is performed. A device model of a double-side polishing machine is Peter Wolters AC 2000. The polishing process is divided into two steps including a coarse polishing and then a fine polishing. A total polishing removal amount is 8 µm. Subsequently, the single-side polishing process is performed for accurately controlling the thickness of the silicon wafer. A device model of a single-side polishing machine is IPEC 372. The polishing process is also divided into two steps including a coarse polishing and then a fine polishing. A polishing removal amount is not greater than 2 µm. After the removal, an error of the total thickness of the substrate can be smaller than 1 µm.

Furthermore, it is optional to perform an insulating process on the supporting substrate 190 before the bonding process, such that an insulating and corrosion resistance layer covers the supporting substrate 190. More particularly, the corrosion resistance layer covers a back surface. A preferred insulating process may be a common oxidation process or a PECVD for depositing silicon dioxide, silicon nitride and so on. A thickness of the corrosion resistance layer is 1 µm in general. Since the following process is a reinforcing process at a low temperature, the supporting substrate 190 might not resist corrosion of TMAH solution in the following chamfering process and many corrosion pits are formed on the back surface. Accordingly, the insulating and corrosion resistance layer is formed in advance for protecting the back surface of the supporting substrate.

After the preprocesses are performed on the supporting substrate 190, a cleaning process and a bonding process are performed on the device substrate 100 and the supporting substrate 190. The bonding process may be a common hydrophilic bonding or a hydrophobic bonding, and it also may be a plasma assisted hydrophilic bonding. The hydrophilic bonding and the plasma assisted hydrophilic bonding are preferred. Taking the hydrophilic bonding for example herein, the substrates are cleaned by utilizing SC1 and SC2 solutions in sequence. Before the bonding process, a rotary cleaning process is performed on the device substrate 100 and the supporting substrate 190 by a bonding machine EVG 801, thereby removing particles which might exist on the surfaces and adsorbing more water molecules. Then, the device substrate 100 is bonded with the supporting substrate 190.

Referring to Step S14, an annealing and reinforcing process is performed on the bonding interface, such that an adherence level of the bonding interface meets requirements in the following chamfering grinding, thinning and polishing processes. An annealing and reinforcing temperature is 900° C.-1400° C. A preferred temperature is 1050° C. An annealing and reinforcing time is 0.5-10 hours. A preferred time is 6 hours. A heat-up rate is 0.5-20° C./minute. A preferred heat-up rate is 3° C./minute. A preferred annealing atmosphere is a dry oxidation atmosphere or a wet oxidation atmosphere. When only the above-mentioned first and second heating treatment steps are performed, the present step makes the nucleation of the oxygen elements in the previous annealing step at the low temperature form a larger oxygen precipitation, and meanwhile the oxygen precipitation can getter metal impurities in the denuded zone.

An additional reinforcing step is not required when the conditions in the above-mentioned annealing and reinforcing process are utilized. That is, step S16 is not required. In order to avoid that the impurities diffuse in the denuded zone 101 of the device substrate 100 in the annealing and reinforcing process, moderate conditions may be chosen in the present step and then the additional reinforcing step is implemented in the following step S16. For example, an annealing and reinforcing temperature is chosen at 500-1200° C., A preferred temperature is 900° C. A reinforcing time is 1-10 hours. A preferred time is 4 hours. An annealing and reinforcing atmosphere is N$_2$, Ar (or other inert gas), O$_2$, N$_2$/O$_2$ mixture, Ar/O$_2$ mixture and so on. The above-mentioned moderate annealing conditions can have reinforcing effect on the bonding interface for satisfying the requirements in the following chamfering grinding, thinning and polishing processes.

Figure 2E:
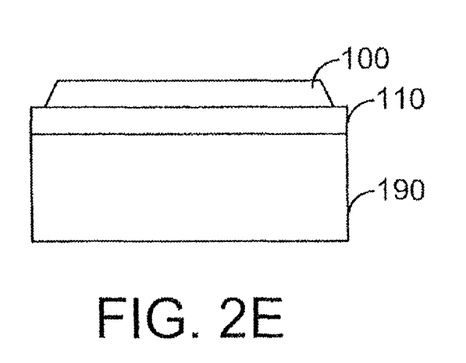

Referring to Step S15 as shown in FIG. 2E, the chamfering grinding, thinning and polishing processes are performed on the bonded device substrate 100. FIG. 2E shows a state after the above-mentioned processes are implemented. It is noted that controlling a removal amount in the thinning and polishing processes can ensure that the remained device substrate 100 in FIG. 2E is totally composed of the denuded zone 101.

A chamfering process is performed on the device substrate 100 after the reinforcing process. A chamfering width is determined by specification required by the following device processes. A thickness of a residual layer in an edge after polishing is 0-150 μm. A preferred thickness is 100 μm. The chamfered device substrate 100 is etched in TMAH solution for removing the residual layer in the edge by 100 μm. A preferred method is to spray THAH solution with a spin etching method. During the etching process, the substrate pair is rotated. A rotational speed is 100-10000 rpm. A preferred rotational speed is 1000 rpm. A preferred temperature of the THAM solution is 95° C. The reinforced device substrate 100 is ground and thinned. A preferred grinding apparatus is a single-side grinding machine. A device model of the grinding machine is DFG841. Firstly, a coarse grinding process is performed for achieving rapid thinning at a grinding wheel speed greater than 2000 rpm. Then, a fine grinding process is performed for reducing damage resulted from the coarse grinding process at a grinding wheel speed greater than 2000 rpm. After the grinding processes, the thickness of the device substrate 100 should be greater than the target thickness of the device layer of the final product by at least 3 μm. Herein, the device substrate 100 is thinned to be 12 μm. A polishing process is performed on the ground device substrate 100. The polishing process may be a single-side polishing process or a double-side polishing process, and it may be the double-side polishing process together with the single-side polishing process. Herein, the preferred polishing process is the double-side polishing process together with the single-side polishing process. Firstly, the double-side polishing process is performed. A device model of a double-side polishing machine is Peter Wolters AC 2000. The polishing process is divided into two steps including a coarse polishing and then a fine polishing. A total polishing removal amount is 4 μm. Subsequently, the single-side polishing process is performed for accurately controlling the thickness of the silicon wafer. A device model of a single-side polishing machine is IPEC 372. The polishing process is also divided into two steps including a coarse polishing and then a fine polishing. A polishing removal amount is not greater than 2 μm. After the polishing processes, the remained device substrate 100 is totally composed of the denuded zone 101.

In step S16, an additional annealing and reinforcing process is performed on the bonding interface. When the moderate conditions of the annealing and reinforcing process in step S14 are utilized, the present step is required for enhancing a bonding strength between the supporting substrate 190 and the insulating layer 110 and forming covalent bonds in the bonding interface. An annealing temperature in the present step is 900-1400° C. A preferred annealing temperature is 1150° C. An annealing time is 0.5-10 hours. A preferred time is 4 hours. A heat-up rate is 0.5-20° C./minute. A preferred heat-up rate is 3° C./minute. A preferred annealing atmosphere is a dry oxidation atmosphere or a wet oxidation atmosphere. For the device substrate 100 made of the single crystal silicon material, an oxide layer is further formed on the surface of the device substrate 100 during the oxidation process. The thickness of the device substrate 100 may be controlled by controlling the thickness of the oxide layer, thereby achieving an object of accurately controlling the thickness of the device layer. After the annealing process, the oxide layer is removed by utilizing HF solution, and the final substrate having a buried insulating layer is obtained. The device layer is composed of the denuded zone 101 of the device substrate 100.

An advantage of the above-mentioned technical scheme is that the gettering process is performed on the device substrate 100 before bonding. The denuded zone 101 is formed on the surface, and then the denuded zone 101 is transferred to the supporting substrate 190 for obtaining bonding material with high crystal quality. For further consideration of thermal stability of the oxygen precipitation inside the device substrate 100, two steps of annealing processes may be chosen to be implemented in the preparing process. The first annealing step is a low-temperature annealing, such that the bonding strength meets the requirements in the grinding and polishing processes. Finally, the second step is utilized for reinforcing the bonding strength for forming covalent bonds in the interface.

Furthermore, in the heating treatment process, only the first and second heating treatment steps are performed on the device substrate 100, and the third high-temperature heating treatment step and the subsequent step of reinforcing the bonding interface are integrated as one step, thereby reducing the process complexity, saving the process cost and increasing the process efficiency.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. A method for preparing a semiconductor substrate with an insulating buried layer by a gettering process, comprising the following steps of:
   providing a device substrate and a supporting substrate;
   forming an insulating layer on a surface of the device substrate;
   performing a heating treatment on the device substrate, so as to form a denuded zone on the surface of the device substrate, wherein the step of performing the heating treatment on the device substrate further comprises a first heating treatment step for forming a crystal zone on the surface of the device substrate; and a second heating treatment step in which a temperature is lower than a temperature in the first heating treatment step, such that nucleation of saturated oxygen elements outside the denuded zone of the device substrate occurs, and wherein a highest temperature in the second heating treatment step is lower than or equal to a lowest temperature in the first heating treatment step;
   bonding the device substrate having the insulating layer with the supporting substrate, such that the insulating layer is sandwiched between the device substrate and the supporting substrate;
   annealing and, reinforcing a bonding interface by performing a third heating treatment for making the nucleation of the oxygen elements in the second heating treatment step form a larger oxygen precipitation to getter metal impurities in the denuded zone, such that an adherence level of the bonding interface meets requirements in the following chamfering grinding, thinning and polishing processes, wherein a lowest temperature in the third heating treatment step is higher than or equal to a highest temperature in the second heating treatment step; and
   performing the chamfering grinding, thinning and polishing processes on the device substrate which is bonded, such that the remained device substrate is totally composed of the denuded zone.

2. The method according to claim 1, wherein the device substrate is a single crystal silicon substrate.

3. The method according to claim 1, further comprising the following step of:

forming a protective layer on an exposed surface of the supporting substrate before performing the chamfering grinding, thinning and polishing processes on the device substrate.

* * * * *

UNITED STATES PATENT AND TRADEMARK OFFICE
CERTIFICATE OF CORRECTION

PATENT NO. : 9,299,556 B2
APPLICATION NO. : 13/976486
DATED : March 29, 2016
INVENTOR(S) : Xing Wei et al.

It is certified that error appears in the above-identified patent and that said Letters Patent is hereby corrected as shown below:

Title Page, item 54 should be corrected as follows:

Change:
-- METHOD FOR PREPARING SEMICONDUCTOR SUBSTRATE WITH INSULATING BURIED LAYER GETTERING PROCESS --
to
"METHOD FOR PREPARING SEMICONDUCTOR SUBSTRATE WITH INSULATING BURIED LAYER BY GETTERING PROCESS"

Signed and Sealed this
Seventh Day of June, 2016

Michelle K. Lee
*Director of the United States Patent and Trademark Office*